(12) United States Patent
Lin et al.

(10) Patent No.: US 6,753,746 B2
(45) Date of Patent: Jun. 22, 2004

(54) PRINTED CIRCUIT BOARD HAVING JUMPER LINES AND THE METHOD FOR MAKING SAID PRINTED CIRCUIT BOARD

(75) Inventors: Wen-Yen Lin, Taoyuan Hsien (TW); Wen-Bo Ho, Taoyuan Hsien (TW)

(73) Assignee: Compeq Manufacturing Co., Ltd., Taoyuan Hsien (TW)

( * ) Notice: Subject to any disclaimer, the term of this patent is extended or adjusted under 35 U.S.C. 154(b) by 72 days.

(21) Appl. No.: 09/985,971

(22) Filed: Nov. 7, 2001

(65) Prior Publication Data

US 2003/0085772 A1 May 8, 2003

(51) Int. Cl.[7] ................................................. H01P 3/08
(52) U.S. Cl. ...................... 333/246; 333/254; 333/116
(58) Field of Search ................................ 333/246, 254, 333/116

(56) References Cited

U.S. PATENT DOCUMENTS

| | | | | |
|---|---|---|---|---|
| 4,783,695 A | * | 11/1988 | Eichelberger et al. | 257/668 |
| 5,108,825 A | * | 4/1992 | Wojnarowski et al. | 428/209 |
| 5,234,745 A | * | 8/1993 | Kawakami et al. | 428/209 |
| 5,262,596 A | * | 11/1993 | Kawakami et al. | 174/261 |
| 5,428,190 A | * | 6/1995 | Stopperan | 174/261 |
| 5,432,677 A | * | 7/1995 | Mowatt et al. | 361/719 |
| 5,449,863 A | * | 9/1995 | Nakatani et al. | 174/250 |
| 5,945,897 A | * | 8/1999 | Pluymers et al. | 333/244 |
| 5,981,043 A | * | 11/1999 | Murakami et al. | 428/209 |
| 6,299,469 B1 | * | 10/2001 | Glovatsky et al. | 439/329 |
| 6,493,198 B1 | * | 12/2002 | Arledge et al. | 361/56 |
| 2002/0055199 A1 | * | 5/2002 | Bergstedt et al. | 438/52 |

OTHER PUBLICATIONS

Dupont, "Kapton Types and Thickness" 1996–1999.*

* cited by examiner

*Primary Examiner*—Robert Pascal
*Assistant Examiner*—Kimberly Glenn
(74) *Attorney, Agent, or Firm*—Rosenberg, Klein & Lee

(57) ABSTRACT

The present invention relates a printed circuit board having jumper lines, and a method for making the printed circuit board. An isolation layer made of a dielectric material is coated on the line layer of the printed circuit board, and multiple pads are formed in the isolation layer, thereby exposing part of the line layer without covered by the isolation layer. A high conductive material is coated on the isolation layer to connect the multiple pads, thereby forming a planar jumper layer that is connected to the line layer through the circular pads. Thus, the planar jumper layer may be made simultaneously during fabrication of the printed circuit board, without having to perform the wire-bonding work.

2 Claims, 11 Drawing Sheets

PRINTED CIRCUIT BOARD HAVING JUMPER LINES AND THE METHOD FOR MAKING SAID PRINTED CIRCUIT BOARD

BACKGROUND OF THE INVENTION

1. Field of the Invention

The present invention relates to a printed circuit board having jumper lines and a method for making the printed circuit board, wherein the planar jumper layer may be made simultaneously during fabrication of the printed circuit board, without having to perform the wire-bonding work.

2. Description of the Related Art

A conventional printed circuit board often needs to use jumpers for reasons of the layout of the circuit.

A conventional coplanar waveguide (C.P.W.) fed uniplanar bow-tie antenna of a microwave circuit of a printed circuit board in accordance with the prior art is shown in FIG. 1.

A conventional Lange coupler of a microwave circuit of a printed circuit board in accordance with the prior art is shown in FIG. 2.

The above microwave circuit comprises a dielectric substrate 12, a metallic ground layer 11 mounted on the bottom side of the dielectric substrate 12, a line layer 13 mounted on the top side of the dielectric substrate 12, and jumpers 14 mounted on the line layer 13.

A conventional coplanar waveguide (C.P.W.) of a microwave circuit of a printed circuit board in accordance with the prior art is shown in FIG. 3. The metallic ground layer 11 is mounted on one side of the dielectric substrate 12, and jumpers 14 are mounted on the metallic ground layer 11.

The jumpers 14 are formed by performing a wire-bonding work, so that after the microwave circuit of the printed circuit board is made, it is necessary to perform a wire-bonding work to form the jumpers 14, thereby causing inconvenience during fabrication and increasing cost of fabrication. In addition, the jumpers cannot be used in the inner layer of a multi-layer printed circuit board.

On the other hand, the printed circuit board includes multiple microwave circuits, such as the power distributors, the couplers, the wave filters, the wavelength converters, the modulators or the like. The wavelength of the microwave is very short, so that the wavelength of the microwave and the size of the microwave circuit belong to the same grade. Thus, many electrical parameters, such as resistance, reluctance, capacitance, conductance or the like, that may be omitted in the low-frequency alternating circuit, have to be considered in the microwave circuit. Change of the size of the microwave circuit will affect the values of the above-mentioned electrical parameters. The microwave circuit may maintain its function only at a determined wavelength (or frequency) and size, so that when the size of the microwave circuit is changed, the microwave circuit will lose its function. Thus, the size of the microwave circuit cannot be shortened arbitrarily, so that the microwave circuit occupies a considerable space in the printed circuit board. Therefore, the printed circuit board cannot be miniaturized, so that it cannot satisfy the requirements of light, thin, short and small designs.

Traditionally, a microwave circuit includes multiple transmission lines with proper sizes to form a proper geometry.

The wavelength of the microstrip transmission line of the line layer 13 can be calculated as flows:

$$\lambda_g \times f = c / \sqrt{\epsilon_{eff}}$$

Wherein, c is the velocity of light, and is equal to 3108 m/sec, $\epsilon_{eff}$ is the effective dielectric constant, f is the frequency of the electromagnetic wave, and $\lambda_g$ is the wavelength of the electromagnetic wave under this effective dielectric constant.

It is known from the above equation that, when the frequency is fixed, if the effective dielectric constant is increased, the wavelength of the electromagnetic wave under this effective dielectric constant may be shortened. Thus, the size of the microwave circuit that is proportional to the wavelength may be shortened. Therefore, when the effective dielectric constant is increased, the size of the microwave circuit may be shortened.

Further, when the media of the microstrip transmission line or the microwave circuit are not even, it is assumed that the equivalent media of the microstrip transmission line or the microwave circuit are even, and the dielectric constant of the equivalent media is the effective dielectric constant $\epsilon_{eff}$. The effective dielectric constant may be calculated as follows:

$$\epsilon_{eff} = C_{substrate} / C_{air}$$

wherein, $C_{substrate}$ is the capacitance of the microstrip transmission line or the non-metallic part of the microwave circuit after being filled with the media, and $C_{air}$ is the capacitance of the air.

At this time, distribution of the dielectric media may be not even, and the microstrip transmission line or the non-metallic part of the microwave circuit is filled with the capacitance of the air. If distribution of the dielectric media is not even, and the dielectric media consist of two dielectric materials, wherein one dielectric material has a higher dielectric constant, and the other has a lower dielectric constant, such that the effective dielectric constant is between the two dielectric constants. Thus, a high dielectric value material may be coated on the entire line layer of the microwave circuit, or coated on partial transmission lines of the line layer, thereby increasing the effective dielectric constant, so as to shorten the size of the microwave circuit, without affecting the electrical function of the microwave circuit.

SUMMARY OF THE INVENTION

The primary objective of the present invention is to provide a printed circuit board having jumper lines, and a method for making the printed circuit board. An isolation layer made of a dielectric material is coated on the line layer of the printed circuit board, and multiple pads are formed in the isolation layer, thereby exposing part of the line layer without covered by the isolation layer. A high conductive material is coated on the isolation layer to connect the multiple pads, thereby forming a planar jumper layer that is connected to the line layer through the circular pads. Thus, the planar jumper layer may be made simultaneously during fabrication of the printed circuit board, without having to perform the wire-bonding work.

In accordance with a first aspect of the present invention, there is provided a method for making a printed circuit board having jumper lines, comprising the steps of:

a) making a printed circuit board;

b) coating or printing a dielectric material on the printed circuit board to form an isolation layer;

c) forming multiple pads in the isolation layer of the dielectric material, thereby exposing part of the printed circuit board without covered by the dielectric material; and d) coating or printing a high conductive material on the isolation layer of the dielectric material to connect the multiple pads, thereby forming a planar jumper layer that is connected to the printed circuit board through the circular pads.

In accordance with a second aspect of the present invention, there is provided a method for making a printed circuit board having jumper lines, comprising the steps of:

a) determining a pre-estimated value of an effective dielectric constant;

b) determining a shortened size of a microwave circuit according to the pre-estimated value of the effective dielectric constant and a used working frequency;

c) providing a dielectric substrate that may increase the effective dielectric constant to the pre-estimated value;

d) making the microwave circuit with a shortened size on the dielectric substrate;

e) coating or printing an isolation layer on the microwave circuit;

f) forming multiple pads in the isolation layer, thereby exposing part of the microwave circuit without covered by the isolation layer; and g) coating or printing a high conductive material on the isolation layer to connect the multiple pads, thereby forming a planar jumper layer that is connected to the microwave circuit through the circular pads.

In accordance with a third aspect of the present invention, there is provided a printed circuit board having jumper lines, comprising: a line layer, an isolation layer made of a dielectric material coated on the line layer, multiple pads formed in the isolation layer, thereby exposing part of the line layer without covered by the isolation layer, and a high conductive material coated on the isolation layer to connect the multiple pads, thereby forming a planar jumper layer that is connected to the line layer through the circular pads.

In accordance with a fourth aspect of the present invention, there is provided a printed circuit board having jumper lines, comprising: a dielectric substrate, a metallic ground layer mounted on a first side of the dielectric substrate, and a line layer mounted on a second side of the dielectric substrate, an isolation layer made of a high dielectric value material coated on the line layer, multiple pads formed in the isolation layer, thereby exposing part of the line layer without covered by the isolation layer, and a high conductive material coated on the isolation layer to connect the multiple pads, thereby forming a planar jumper layer that is connected to the line layer through the circular pads.

In accordance with a fifth aspect of the present invention, there is provided a printed circuit board having jumper lines, comprising: a dielectric substrate, a metallic ground layer mounted on one side of the dielectric substrate, an isolation layer made of a high dielectric value material coated on the metallic ground layer, multiple pads formed in the isolation layer, thereby exposing part of the metallic ground layer without covered by the isolation layer, and a high conductive material coated on the isolation layer to connect the multiple pads, thereby forming a planar jumper layer that is connected to the metallic ground layer through the circular pads.

In accordance with a sixth aspect of the present invention, there is provided a printed circuit board having jumper lines, comprising: a dielectric substrate made of a high dielectric value material, a metallic ground layer mounted on a first side of the dielectric substrate, a line layer mounted on a second side of the dielectric substrate, an isolation layer coated on the line layer, multiple pads formed in the isolation layer, thereby exposing part of the line layer without covered by the isolation layer, and a high conductive material coated on the isolation layer to connect the multiple pads, thereby forming a planar jumper layer that is connected to the line layer through the circular pads.

In accordance with a seventh aspect of the present invention, there is provided a printed circuit board having jumper lines, comprising: a dielectric substrate made of a high dielectric value material, a metallic ground layer mounted on one side of the dielectric substrate, an isolation layer coated on the metallic ground layer, multiple pads formed in the isolation layer, thereby exposing part of the metallic ground layer without covered by the isolation layer, and a high conductive material coated on the isolation layer to connect the multiple pads, thereby forming a planar jumper layer that is connected to the metallic ground layer through the circular pads.

Further benefits and advantages of the present invention will become apparent after a careful reading of the detailed description with appropriate reference to the accompanying drawings.

DETAILED DESCRIPTION OF THE INVENTION

For illustrating the method of the present invention, a Lange coupler of a microwave circuit is taken for example, wherein the length of each side of the Lange coupler is equal to one fourth of a wavelength ($\frac{1}{4}\lambda_g$) of the electromagnetic wave under an effective dielectric constant.

Assuming the effective dielectric constant of the dielectric material (the dielectric substrate and the air) is equal to four (4), and the working frequency of the electromagnetic wave is set at 1 $GH_z$. Then, the length of each side of the Lange coupler of the microwave circuit needs to be equal to 3.75 centimeter.

The effective dielectric constant of the dielectric material may be pre-estimated to be increased to nine (9). Then, the length of each side of the Lange coupler of the microwave circuit may be set to be equal to 2.5 centimeter, thereby forming a Lange coupler of the microwave circuit with a smaller size.

Figure 4:
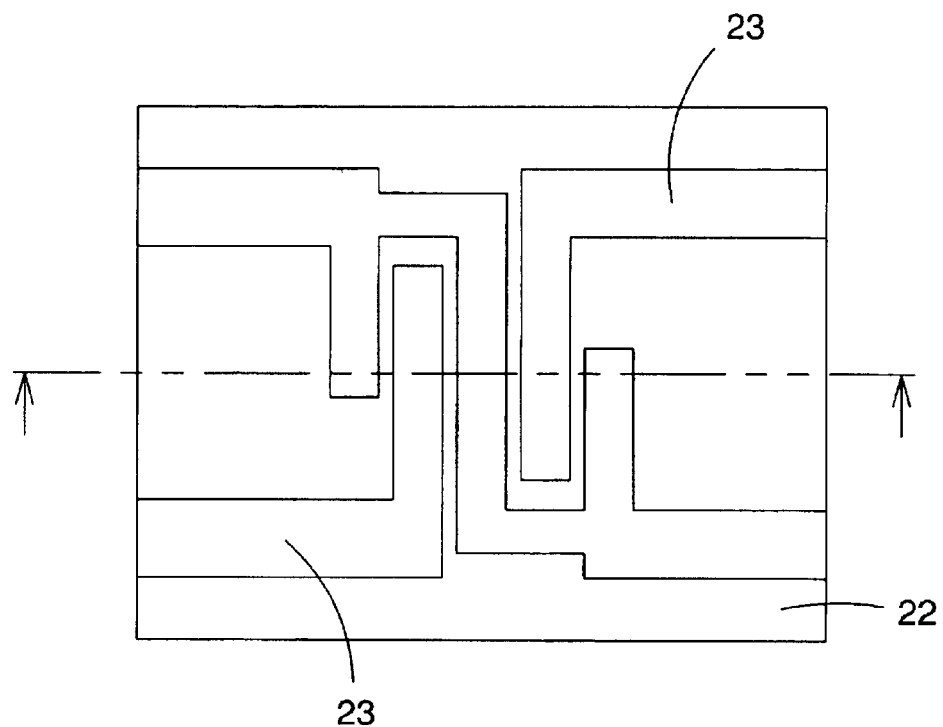
FIG. 4 is a plan view of a Lange coupler of a microwave circuit of a printed circuit board in accordance with the present invention.
Figure 5:
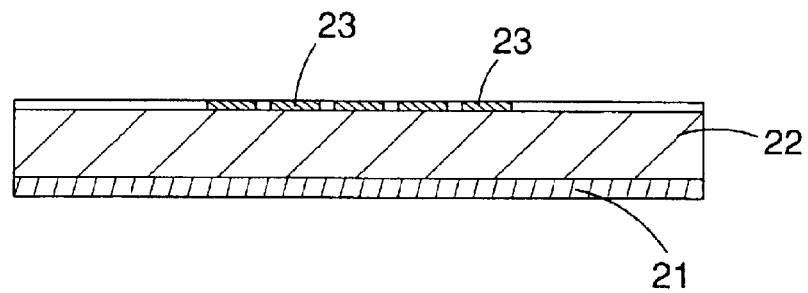
FIG. 5 is a cross-sectional view of the Lange coupler as shown in FIG. 4.

Referring to FIGS. 4–9, the method in accordance with a preferred embodiment of the present invention may be used make an Lange coupler of a microwave circuit which comprises a dielectric substrate 22, a metallic ground layer 21 mounted on the bottom side of the dielectric substrate 22, and a line layer 23 mounted on the top side of the dielectric substrate 22 as shown in FIGS. 4 and 5.

Figure 6:
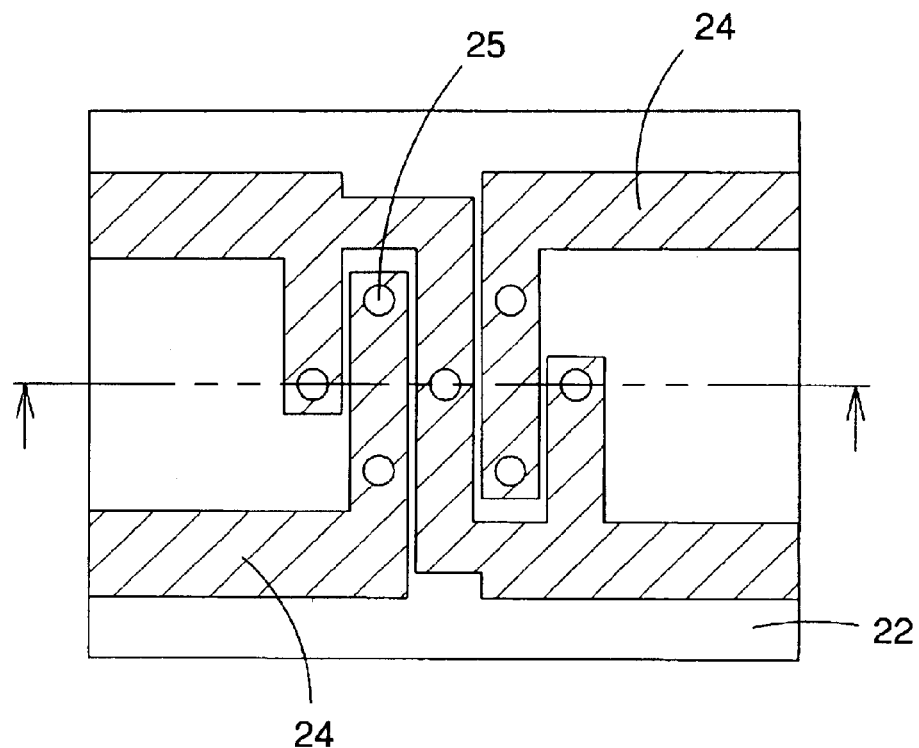
FIG. 6 is a plan view of a Lange coupler of a microwave circuit of a printed circuit board in accordance with the present invention.
Figure 7:
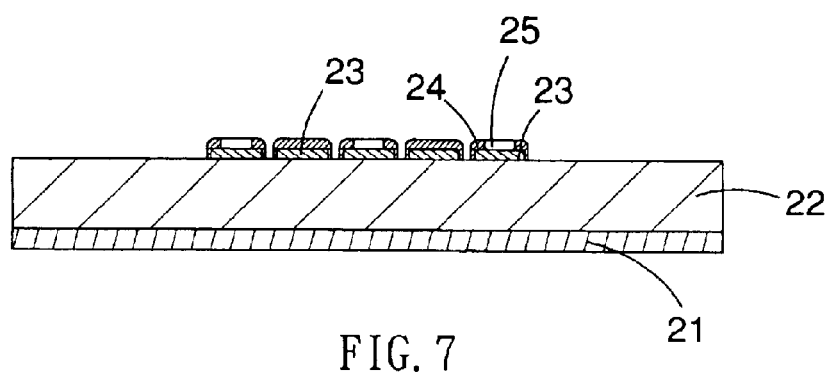
FIG. 7 is a cross-sectional view of the Lange coupler as shown in FIG. 6.

As shown in FIGS. 6 and 7, after the metallic ground layer 21 is mounted on the bottom side of the dielectric substrate 22, and the line layer 23 is mounted on the top side of the dielectric substrate 22, a high dielectric value material 24 may be coated or printed on the line layer 23 of the Lange coupler of the microwave circuit, thereby increasing the effective dielectric constant of the dielectric material to nine (9), such that the size of the Lange coupler of the microwave circuit may be shortened efficiently by increasing the effective dielectric constant of the dielectric material, without affecting the electrical function of the Lange coupler of the microwave circuit. In addition, when the high dielectric value material 24 is coated or printed on the line layer 23 of the Lange coupler of the microwave circuit, multiple circular pads 25 are formed in the high dielectric value material 24, thereby exposing the line layer 23 without coated or printed with the high dielectric value material 24.

Figure 8:
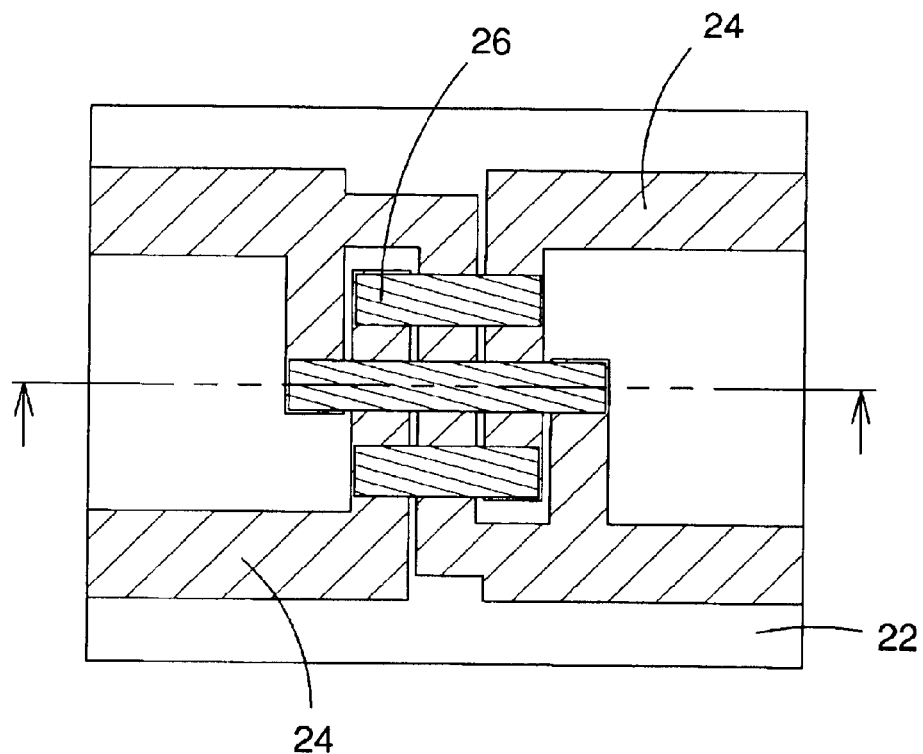
FIG. 8 is a plan view of a Lange coupler of a microwave circuit of a printed circuit board in accordance with the present invention.
Figure 9:
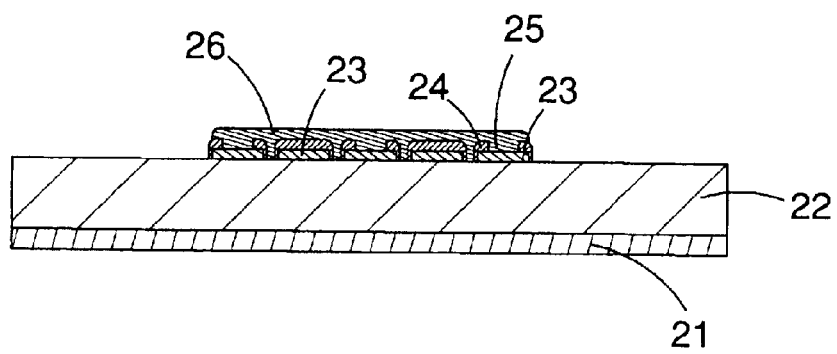
FIG. 9 is a cross-sectional view of the Lange coupler as shown in FIG. 8.

As shown in FIGS. 8 and 9, the high dielectric value material 24 is covered with metallic paste or high conductive material that may be filled into the circular pads 25, thereby forming a planar jumper layer 26 that is connected to the line layer 23 through the circular pads 25.

In such a manner, the high dielectric value material 24 that may efficiently enhance the entire effective dielectric constant of the dielectric material may be used to electrically isolate the line layer 23 and the jumper layer 26, such that the geometric size of the Lange coupler of the microwave circuit may be shortened greatly by increasing the effective dielectric constant of the dielectric material, without affecting the electrical function of the Lange coupler of the microwave circuit.

In the above embodiment, the effective dielectric constant may be increased to nine (9) by coating or printing the high dielectric value material 24.

Alternatively, a dielectric substrate made of a high dielectric value material may be directly used to increase the effective dielectric constant to nine (9). Then, the metallic ground layer is mounted on one side of the dielectric substrate, and the line layer is mounted on the other side of the dielectric substrate, thereby forming the microwave circuit having a shortened size. Thus, the size of the Lange coupler of the microwave circuit may be shortened efficiently by increasing the effective dielectric constant, without affecting the electrical function of the Lange coupler of the microwave circuit. At this time, a common dielectric material may be used to electrically isolate the line layer 23 and the jumper layer 26.

Figure 11:
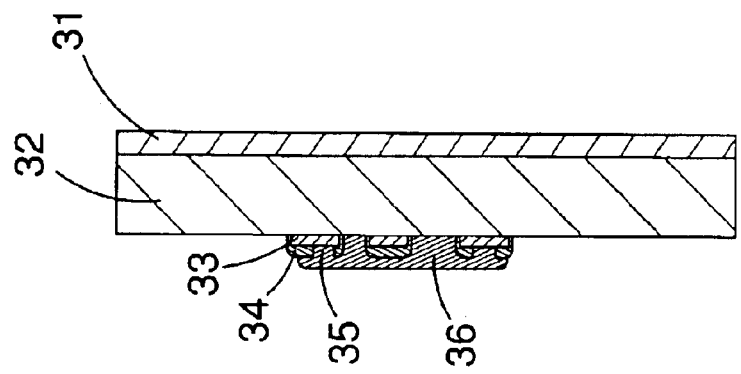
FIG. 11 is a cross-sectional view of FIG. 10.
Figure 10:
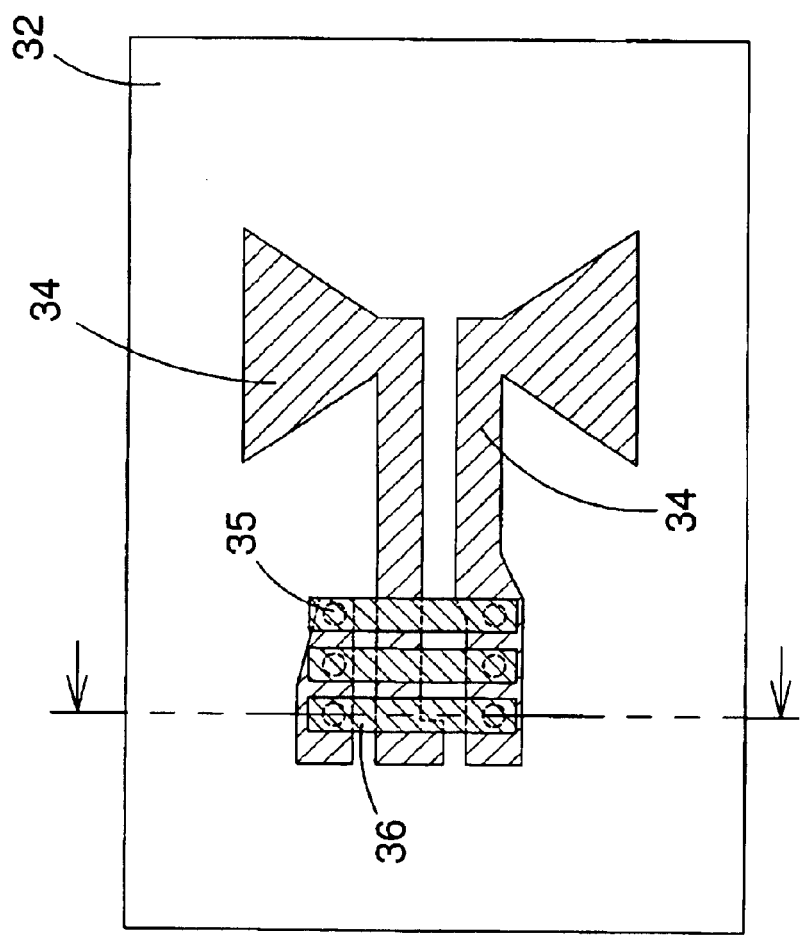
FIG. 10 is a plan cross-sectional view of a coplanar waveguide fed uni-planar bow-tie antenna of a microwave circuit of a printed circuit board in accordance with the present invention.

Referring to FIGS. 10 and 11, the same method in accordance with the present invention may be used make a coplanar waveguide (C.P.W.) fed uni-planar bow-tie antenna of a microwave circuit of a printed circuit board comprising a dielectric substrate 32, a metallic ground layer 31 mounted on the bottom side of the dielectric substrate 32, a line layer 33 mounted on the top side of the dielectric substrate 32, a high dielectric value material 34, and a jumper layer 36.

Figure 12:
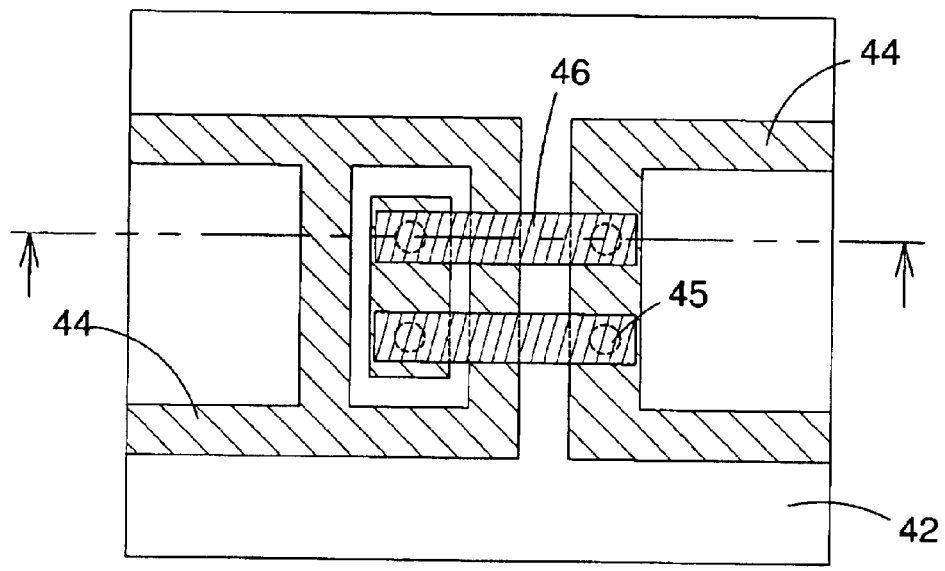
FIG. 12 is a plan view of an unfolded Lange coupler of a microwave circuit of a printed circuit board in accordance with the present invention.
Figure 13:
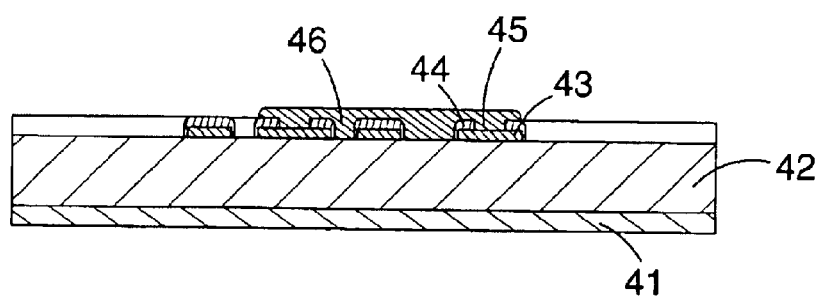
FIG. 13 is a cross-sectional view of the Lange coupler as shown in FIG. 12.

Referring to FIGS. 12 and 13, the same method in accordance with the present invention may be used make an unfolded Lange coupler of a microwave circuit of a printed circuit board comprising a dielectric substrate 42, a metallic ground layer 41 mounted on the bottom side of the dielectric substrate 42, a line layer 43 mounted on the top side of the dielectric substrate 42, a high dielectric value material 44, and a jumper layer 46.

Figure 14:
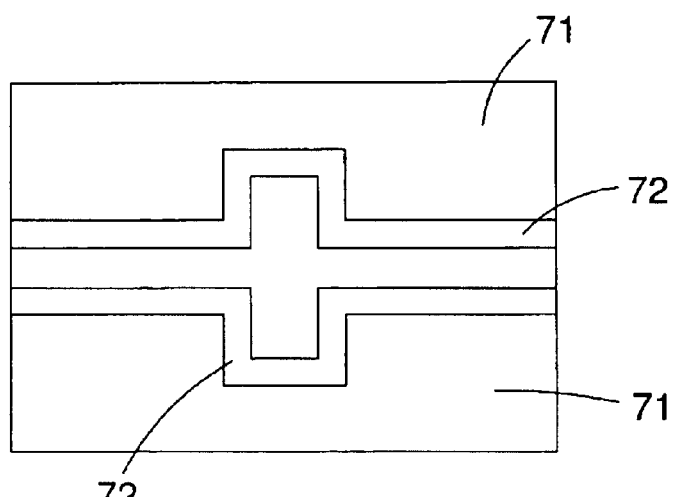
FIG. 14 is a plan view of a coplanar waveguide of a microwave circuit of a printed circuit board in accordance with the present invention.
Figure 15:
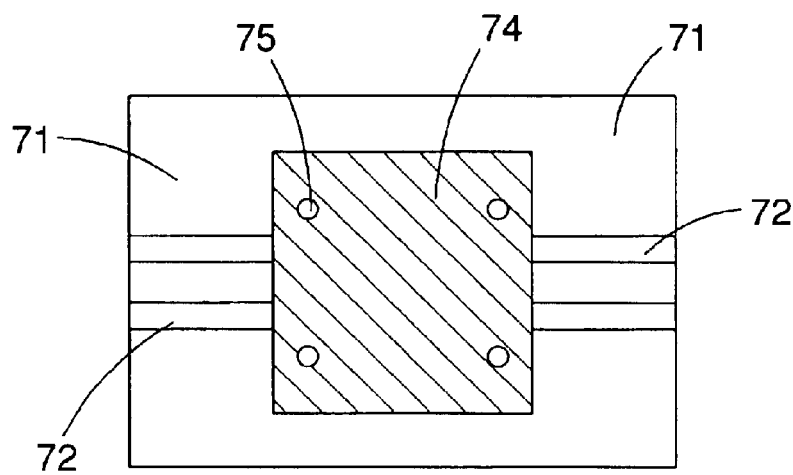
FIG. 15 is a plan view of a coplanar waveguide of a microwave circuit of a printed circuit board in accordance with the present invention.
Figure 16:
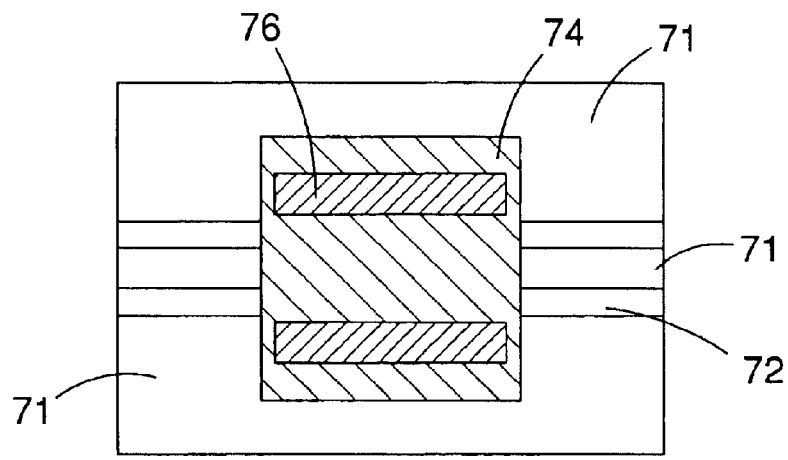
FIG. 16 is a plan view of a coplanar waveguide of a microwave circuit of a printed circuit board in accordance with the present invention.

Referring to FIGS. 14–16, the same method in accordance with the present invention may be used make a coplanar waveguide of a microwave circuit of a printed circuit board. After the metallic ground layer 71 is mounted on the bottom side of the dielectric substrate 72 as shown in FIG. 14, a high dielectric value material 74 may be coated or printed on the metallic ground layer 71 as shown in FIG. 15. At this time, multiple circular pads 75 are formed in the high dielectric value material 74, thereby exposing the metallic ground layer 71 not coated or printed with the high dielectric value material 74. Then, the high dielectric value material 74 is covered with metallic paste or high conductive material that may be filled into the circular pads 75, thereby forming a planar jumper layer 76 (as shown in FIG. 16) that is connected to the metallic ground layer 71 through the circular pads 75.

Figure 17:
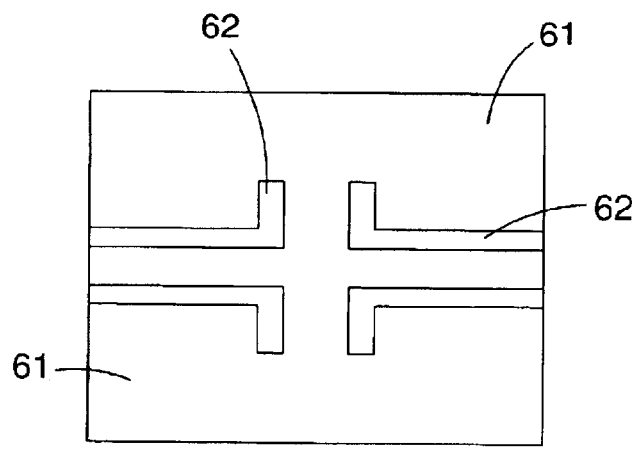
FIG. 17 is a plan view of another coplanar waveguide of a microwave circuit of a printed circuit board in accordance with the present invention.
Figure 18:
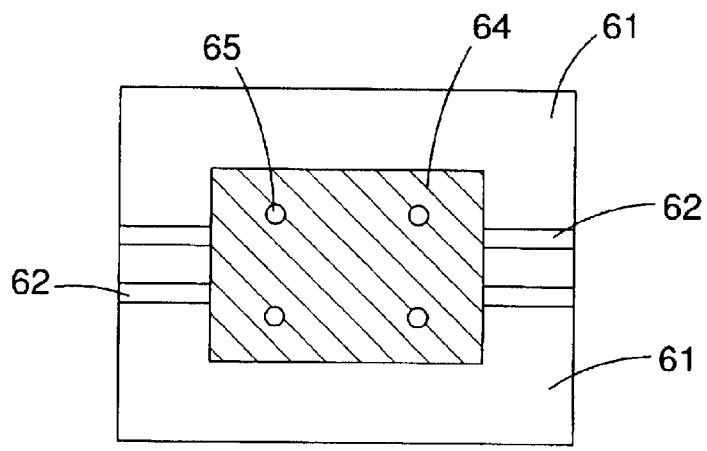
FIG. 18 is a plan view of another coplanar waveguide of a microwave circuit of a printed circuit board in accordance with the present invention.
Figure 19:
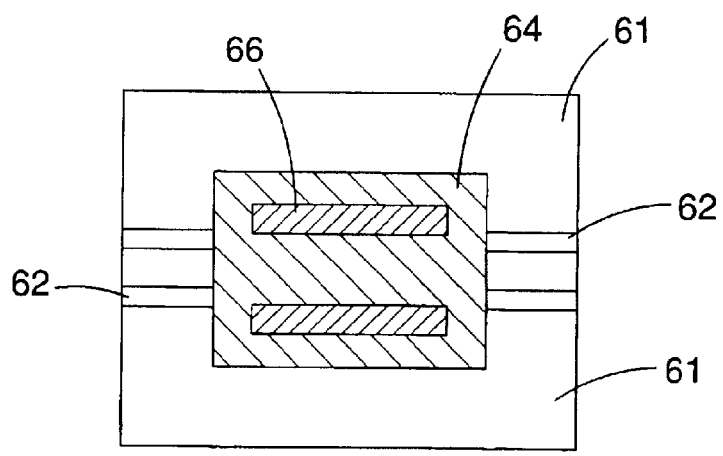
FIG. 19 is a plan view of another coplanar waveguide of a microwave circuit of a printed circuit board in accordance with the present invention.

Referring to FIGS. 17–19, the same method in accordance with the present invention may be used make another type coplanar waveguide of a microwave circuit of a printed circuit board. After the metallic ground layer 61 is mounted on the bottom side of the dielectric substrate 62 as shown in FIG. 17, a high dielectric value material 64 may be coated or printed on the metallic ground layer 61 as shown in FIG. 18. At this time, multiple circular pads 65 are formed in the high dielectric value material 64, thereby exposing the metallic ground layer 61 not coated or printed with the high dielectric value material 64. Then, the high dielectric value material 64 is covered with metallic paste or high conductive material that may be filled into the circular pads 65, thereby forming a planar jumper layer 66 (shown in FIG. 19) that is connected to the metallic ground layer 61 through the circular pads 65.

Figure 20:
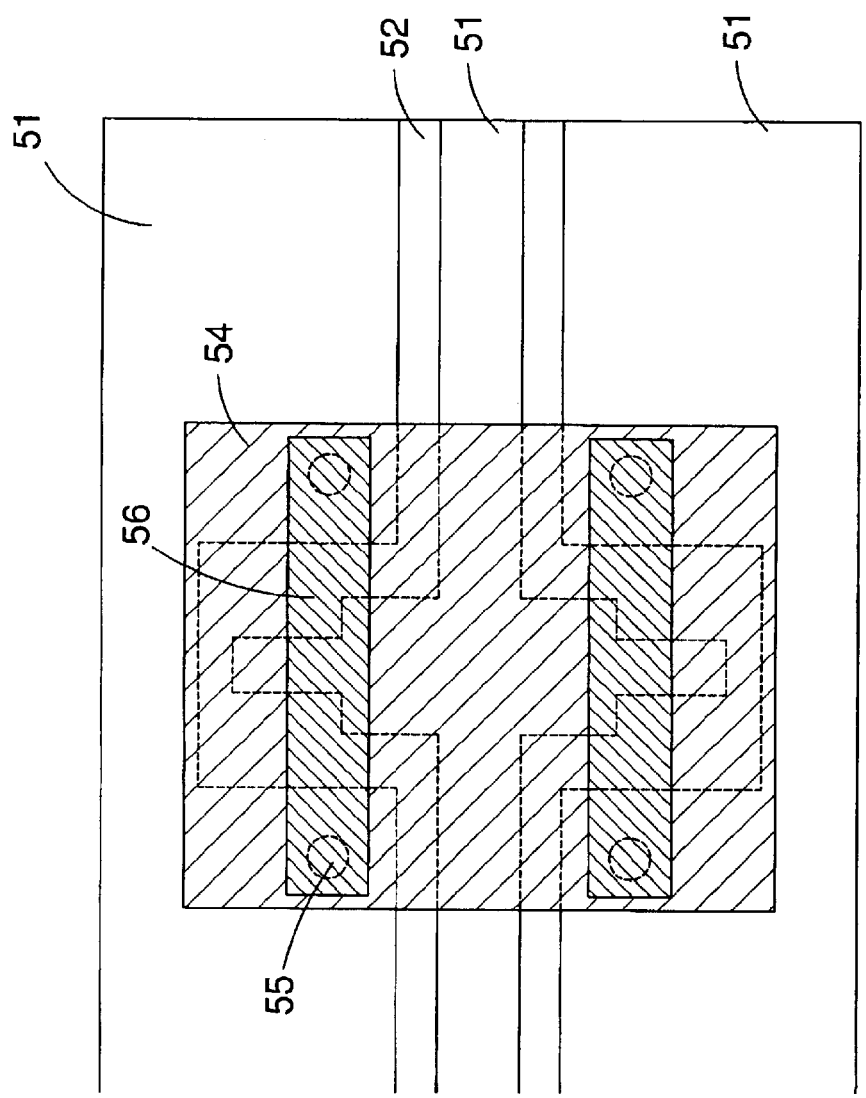
FIG. 20 is a plan view of a further coplanar waveguide of a microwave circuit of a printed circuit board in accordance with the present invention.

Referring to FIG. 20, the same method in accordance with the present invention may be used make another type coplanar waveguide of a microwave circuit of a printed circuit board. After the metallic ground layer 51 is mounted on the bottom side of the dielectric substrate 52, a high dielectric value material 54 may be coated or printed on the metallic ground layer 51. At this time, multiple circular pads 55 are formed in the high dielectric value material 54, thereby exposing the metallic ground layer 51 not coated or printed with the high dielectric value material 54. Then, the high dielectric value material 54 is covered with metallic paste or high conductive material that may be filled into the circular pads 55, thereby forming a planar jumper layer 55 that is connected to the metallic ground layer 51 through the circular pads 55.

Figure 1:
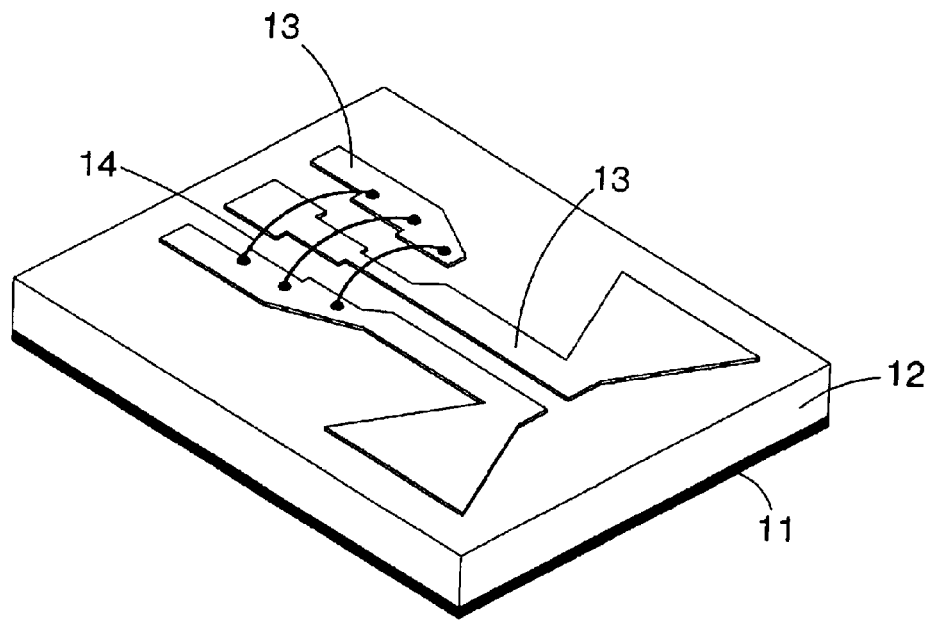
FIG. 1 is a perspective view of a conventional coplanar waveguide fed uni-planar bow-tie antenna of a microwave circuit of a printed circuit board in accordance with the prior art.
Figure 2:
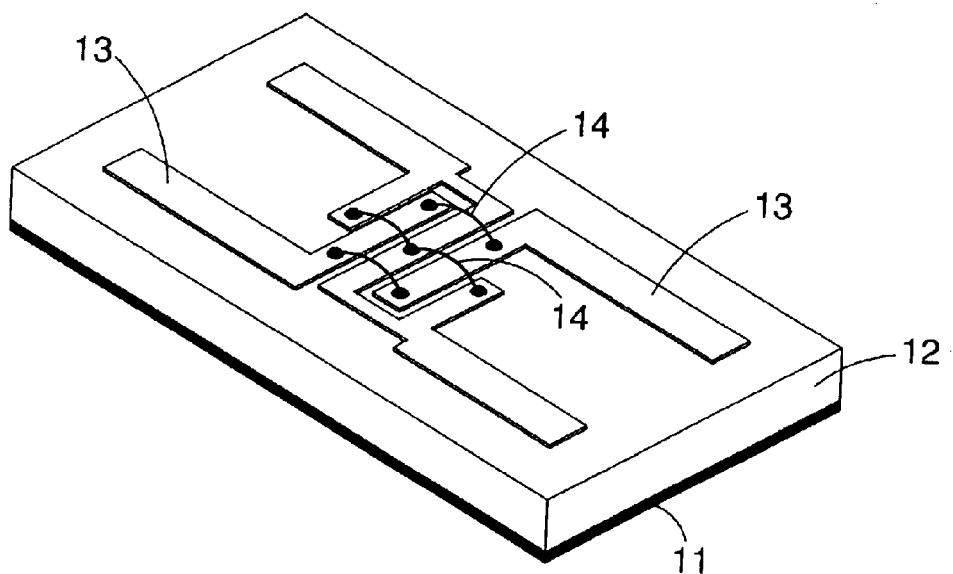
FIG. 2 is a perspective view of a conventional Lange coupler of a microwave circuit of a printed circuit board in accordance with the prior art.
Figure 3:
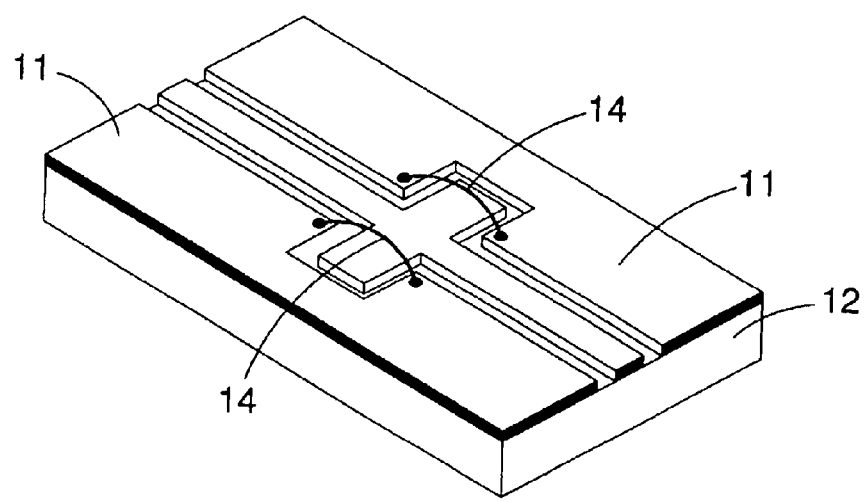
FIG. 3 is a perspective view of a conventional coplanar waveguide of a microwave circuit of a printed circuit board in accordance with the prior art.
Figure 21:
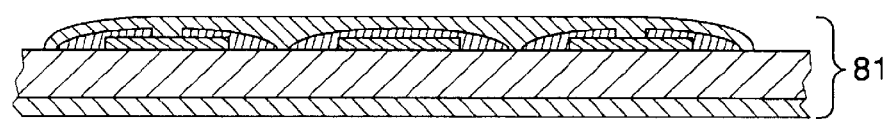
FIG. 21 is a cross-sectional assembly view of a printed circuit board in accordance with the present invention.
Figure 22:
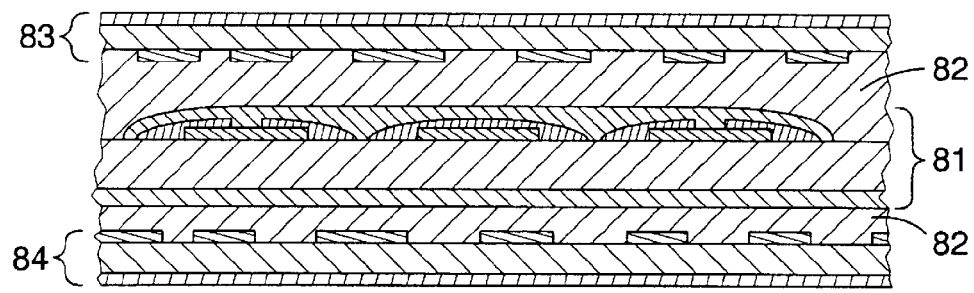
FIG. 22 is a cross-sectional assembly view of a printed circuit board used in a multi-layer printed circuit board in accordance with the present invention.

Referring to FIGS. 2 and 22, the same method in accordance with the present invention may be used make a multi-layer printed circuit board. A first circuit board 81 as shown in FIG. 21 is made by the above-mentioned method so as to have a shortened size with a planar jumper layer. Then, a second circuit board 83 and a third circuit board 84 may be pressed on the first circuit board 81 by prepregs 82 and 82' respectively, and conductive through holes (such as copper through holes) may be used to electrically connect the lines of multiple layers. Finally, the copper layer at the outermost layer is formed with the required lines.

Accordingly, in accordance with the present invention, the planar jumper layer may be made simultaneously during fabrication of the printed circuit board, and may be used in the inner layer of a multi-layer printed circuit board, thereby increasing the usage of area of the circuit board, and thereby reducing production of noise.

In addition, the high dielectric value material may only be printed or coated on a line or a component that has requirements of a specific wavelength, so as to reduce the area of the entire microwave circuit, without having to coat or print the high dielectric value material on all of the lines or structures of the entire microwave circuit, thereby saving the high dielectric value material.

Further, the high dielectric value material may be formed by adding ceramic powder (such as $BaTiO3$) in the resin, and the dielectric constant of the high dielectric value material is better greater than 5. The metallic paste may be formed by adding metallic powder in the resin, and may be replaced by a high molecular material of high conductance.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A method for making a printed circuit board having jumper lines, comprising the steps of:
   a) determining a pre-estimated value of an effective dielectric constant;
   a1) determining a shortened size of a microwave circuit according to the pre-estimated value of the effective dielectric constant and a used working frequency;
   a2) making a printed circuit board containing the microwave circuit according to the shortened size that is determined;
   b) coating or printing a high dielectric value material on the printed circuit board to form an isolation layer;
   c) forming multiple pads in the isolation layer of the high dielectric value material, thereby exposing part of the printed circuit board not covered by the high dielectric value material; and
   d) coating or printing a high conductive material on the isolation layer of the high dielectric value material to connect the multiple pads, thereby forming a planar jumper layer that is connected to the printed circuit board through the pads.

2. A method for making a printed circuit board having jumper lines, comprising the steps of:
   a) determining a pre-estimated value of an effective dielectric constant;
   b) determining a shortened size of a microwave circuit according to the pre-estimated value of the effective dielectric constant and a used working frequency;
   c) providing a dielectric substrate that can increase the effective dielectric constant to the pre-estimated value;
   d) making the microwave circuit with a shortened size on the dielectric substrate;
   e) coating or printing an isolation layer on the microwave circuit;
   f) forming multiple pads in the isolation layer, thereby exposing part of the microwave circuit not covered by the isolation layer; and
   g) coating or printing a high conductive material on the isolation layer to connect the multiple pads, thereby forming a planar jumper layer that is connected to the microwave circuit through the pads.

* * * * *